United States Patent
Gardner et al.

[19]

[11] Patent Number: 6,124,172
[45] Date of Patent: Sep. 26, 2000

[54] METHOD OF MAKING A SEMICONDUCTOR DEVICE HAVING SOURCE/DRAIN STRUCTURES WITH SELF-ALIGNED HEAVILY-DOPED AND LIGHTLY-DOPED REGIONS

[75] Inventors: Mark I. Gardner, Cedar Creek; Mark C. Gilmer, Austin, both of Tex.

[73] Assignee: Advanced Micro Devices, Inc., Sunnyvale, Calif.

[21] Appl. No.: 09/163,688

[22] Filed: Sep. 30, 1998

[51] Int. Cl.[7] ............... H01L 21/331; H01L 21/335; H01L 21/336
[52] U.S. Cl. ............ 438/301; 438/514; 438/526; 438/531; 438/532; 257/288; 257/336; 257/344; 257/408
[58] Field of Search .................. 438/305, 303, 438/301, 304; 257/388, 336, 344

[56] References Cited

U.S. PATENT DOCUMENTS

| | | | |
|---|---|---|---|
| 4,818,715 | 4/1989 | Chao | 438/303 |
| 4,907,048 | 3/1990 | Huang | 357/23.9 |
| 5,061,647 | 10/1991 | Roth et al. | 438/304 |
| 5,256,586 | 10/1993 | Choi et al. | 438/304 |
| 5,276,347 | 1/1994 | Wei et al. | 257/388 |
| 5,726,479 | 3/1998 | Matsumoto et al. | 257/412 |
| 5,863,837 | 1/1999 | Sudo | 438/692 |

OTHER PUBLICATIONS

Wolf, *Silicon Processing for the VLSI Era*, Lattice Press, vol. 2; Process Integration, pp. 354–363 (1960).

S. Wolf, "Silicon Processing for the VLSI Era", vol. 2, Lattice Press, CA, USA, 1990.

*Primary Examiner*—Tom Thomas
*Assistant Examiner*—Bernard E. Souw

[57] ABSTRACT

A method of making a semiconductor device includes forming gate electrode over a substrate and a protective layer over the gate electrode. A portion of the protective layer is selectively removed to expose a peripheral region of the gate electrode. A remainder of the protective layer remains disposed over a central region of the gate electrode. An upper portion of the peripheral region of the gate electrode is then removed typically leaving an underlying portion. Often, a dopant material is implanted into the substrate adjacent to and beneath the underlying portion to simultaneously form lightly-doped and heavily-doped regions beneath and adjacent to the underlying portion, respectively. In addition, all or part of the underlying portion may be oxidized to provide a gate electrode with reduced width.

27 Claims, 5 Drawing Sheets

METHOD OF MAKING A SEMICONDUCTOR DEVICE HAVING SOURCE/DRAIN STRUCTURES WITH SELF-ALIGNED HEAVILY-DOPED AND LIGHTLY-DOPED REGIONS

FIELD OF THE INVENTION

The present invention is, in general, directed to a semiconductor device and a method of manufacture thereof. More particularly, the present invention relates to methods of making a semiconductor device having source/drain structures with self-aligned heavily-doped and lightly-doped regions and/or a narrow gate electrode.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor. The MOS transistor is used as one of the basic building blocks of most modern electronic circuits. Thus, such circuits realize improved performance and lower costs as the performance of the MOS transistor is increased and as the manufacturing costs are reduced.

A typical MOS semiconductor device generally includes a semiconductor substrate on which a gate electrode is disposed. The gate electrode, which acts as a conductor, receives an input signal to control operation of the device. Source and drain regions are typically formed in regions of the substrate adjacent to the gate electrodes by heavily doping the regions with a dopant material of a desired conductivity. The conductivity of the doped region depends on the type and concentration of the impurity used to dope the region. The typical MOS transistor is symmetrical, which means that the source and drain are interchangeable. Whether a region acts as a source or drain typically depends on the respective applied voltages and the type of device being made. The collective term source/drain region is used herein to generally describe an active region used for the formation of either a source or drain.

A channel region is formed in the semiconductor substrate beneath the gate electrode and between the source and drain regions. The channel is typically lightly-doped with a dopant material. The gate electrode is generally separated from the substrate by an insulating layer, typically an oxide layer such as $SiO_2$. The insulating layer is provided to prevent current from flowing between the gate electrode and the source, drain or channel regions. In operation, a voltage is typically developed between the source and drain terminals. When an input voltage is applied to the gate electrode, a transverse electric field is set up in the channel region. By varying the transverse electric field, it is possible to modulate the conductance of the channel region between the source and drain regions. In this manner, an electric field is used to control the current flow through the channel region. This type of device is commonly referred to as a MOS field-effect-transistor (MOSFET).

MOS devices typically fall in one of two groups depending on the type of dopant materials used to form the source, drain and channel regions. The two groups are often referred to as n-channel and p-channel devices. The type of channel is identified based on the conductivity type of the channel which is developed under the transverse electric field. In an n-channel MOS (NMOS) device, for example, the conductivity of the channel under a transverse electric field is of the conductivity type associated with n-type impurities (e.g., arsenic or phosphorous). Conversely, the channel of a p-channel MOS (PMOS) device under the transverse electric field is associated with p-type impurities (e.g., boron).

A number of different techniques and fabrication processes may be used to form MOS devices. With reference to FIGS. 1A–1E, one typical MOS fabrication process is depicted to form semiconductor structures with source/drain structures having heavily-doped regions and adjacent lightly-doped regions commonly referred to as lightly-doped rain (LDD) regions. LDD structures are often used in the formation of semiconductor devices having short channels to prevent or reduce short-channel effects.

Figure 1A:
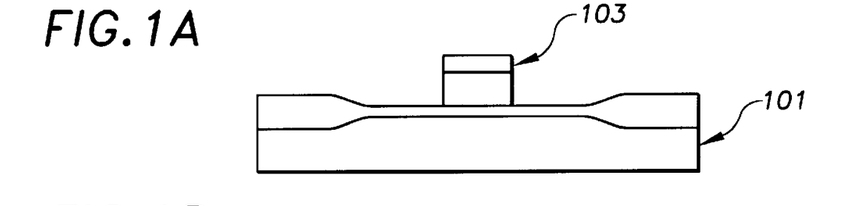
FIGS. 1A through 1E illustrate a conventional process for forming a semiconductor device.
Figure 1B:
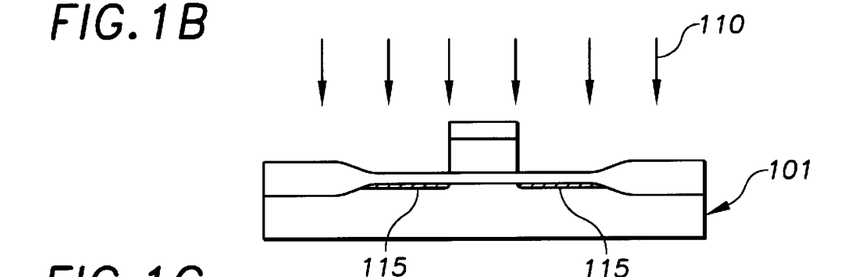
Figure 1C:
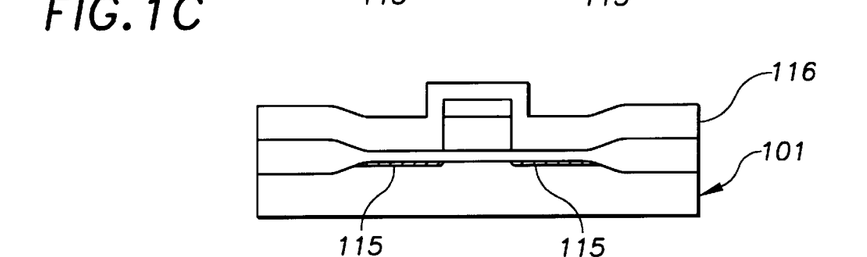
Figure 1D:
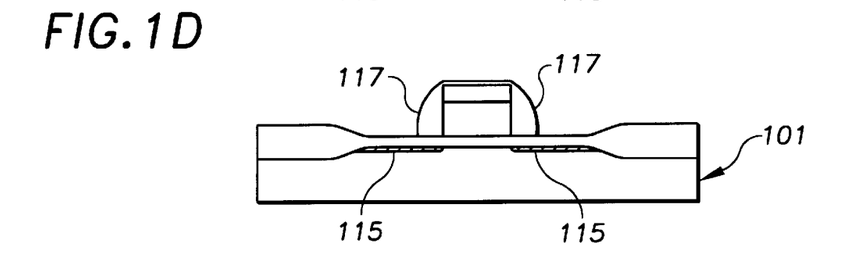
Figure 1E:
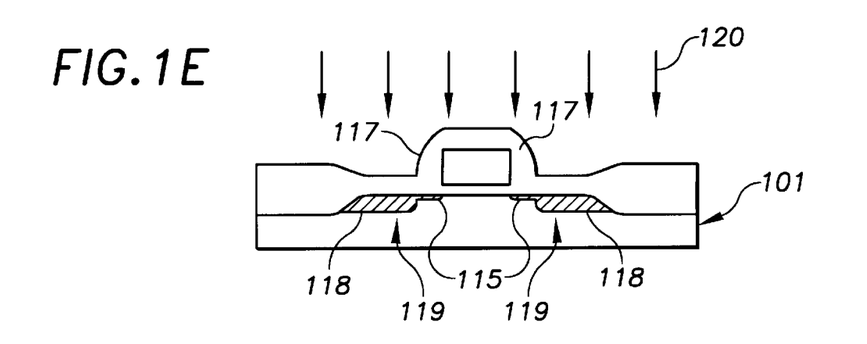

As depicted in FIG. 1A, a gate electrode 103 is formed on a substrate 101. An LDD region 115 is formed in the substrate 101 by implanting a relatively low dose of a dopant material 110 into the exposed areas, as illustrated in FIG. 1B. Following the LDD implant, a spacer layer 116 is formed and etched to form spacers 117 on sidewalls of the gate electrode 103, as illustrated in FIGS. 1C and 1D. The substrate 101 is again implanted with a heavy dose of dopant material 120 aligned with the spacers 117 to form heavily-doped regions 118, which together with the LDD regions 115, form LDD source/drain structures 119, as illustrated in FIG. 1E. Following formation of the LDD structures 119, further processing such as silicidation and interconnect formation is performed. A more detailed description of the elements and fabrication of source/drain structures may be found in S. Wolf, *Silicon Processing for the VLSI Era*, Vol. 2: Processing Integration, pp. 354–363.

Semiconductor devices, like the one described above, are used in large numbers to construct most modern electronic devices. In order to increase the capability of such electronic devices, it is necessary to integrate even larger numbers of such devices into a single silicon wafer. As the semiconductor devices are scaled down (i.e., made smaller) to form a larger number of devices on a given surface area, the structure of the devices and fabrication techniques used to make such devices must be altered.

The above described conventional techniques for forming MOS devices impose limitations on the minimum gate width and on the proper alignment of the independently-formed lightly-doped and heavily-doped regions of the source/drain structures. For example the minimum width of the gate electrode presently depends on the resolution of the photolithographic techniques employed. Thus, there is a need for new methods for forming narrower gate electrodes, including methods that are not limited by photolithographic resolution.

Moreover, as the size of semiconductor devices decreases, it becomes critical to ensure that structures, such as lightly-doped and heavily-doped regions in source/drain structures, are properly aligned with each other and with other structures of the device, such as the gate electrode. Thus, there is a need for methods of manufacture that provide accurate alignment of these structures.

SUMMARY OF THE INVENTION

Generally, the present invention relates to a variety of techniques for forming a semiconductor device having self-aligned heavily-doped and lightly-doped regions and/or a narrower gate. One embodiment of the invention is a method for making a semiconductor device. A gate electrode is formed over a substrate and a protective layer is formed over the gate electrode. Next a portion of the protective layer is selectively removed to expose a peripheral region of the gate electrode. A remainder of the protective layer remains disposed over a central region of the gate electrode. An upper portion of the peripheral region of the gate electrode is then removed typically leaving an underlying portion. A dopant material may be implanted into the substrate adjacent to and beneath the underlying portion. Often, lightly-doped and heavily-doped regions are simultaneously formed beneath and adjacent to the underlying portion of the peripheral region of the gate electrode, respectively, during this implantation process. In addition or alternatively, all or part of the underlying portion may be oxidized to provide a gate electrode with reduced width.

Another embodiment of the invention is a semiconductor device having a substrate and a gate electrode disposed over the substrate. The gate electrode has a central region with a first thickness and a peripheral region extending laterally from the central region with a second thickness that is less than the first thickness.

The above summary of the present invention is not intended to describe each disclosed embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention is believed to be applicable to a number of semiconductor devices using gate electrodes. Such semiconductor devices may include NMOS, CMOS, PMOS and BiCMOS devices for example. The invention has been found to be particularly advantageous in application environments where it is desirable to form source/drain structures having lightly-doped drain (LDD) regions and/or to form a narrow gate electrode in a MOS device. While the present invention is not so limited, an appreciation of various aspects of the invention is best gained through a discussion of various application examples of processes used to form such semiconductor devices.

Figure 2A:
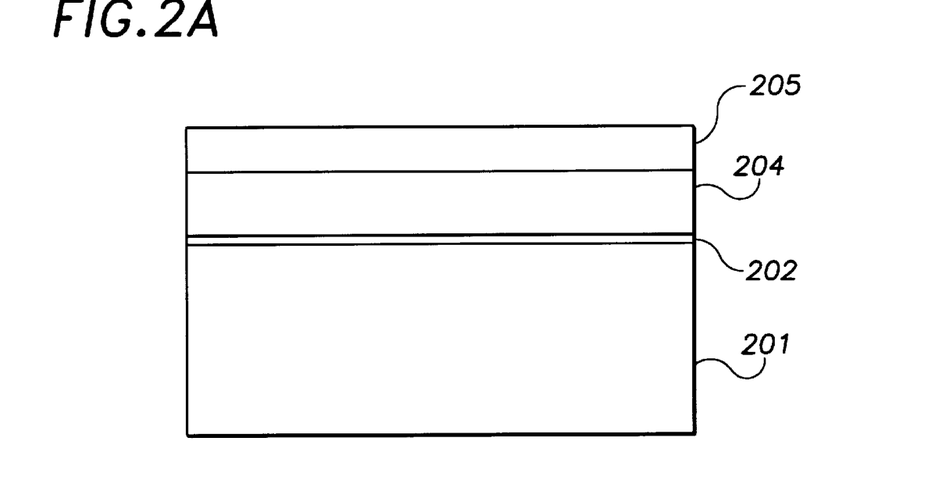
FIGS. 2A through 2E illustrate an exemplary fabrication process for forming a device in accordance with one embodiment of the invention.

FIGS. 2A through 2E illustrate an exemplary process for fabricating a semiconductor device in accordance with one embodiment of the invention. A gate electrode layer 204 is formed on a substrate 201 as illustrated in FIG. 2A. The gate electrode layer 204 is typically insulated from the substrate 201 by a gate insulating layer 202. The gate insulating layer 202 is often formed using an oxide material, such as silicon dioxide. Other materials, however, may be used, including, for example, silicon nitride, silicon oxynitride, nitrided silicon oxide ($SiO_xN_y$), and other oxides, such as metal oxides. The gate insulating layer 202 may be formed by a variety of techniques, including, for example, chemical vapor deposition, physical vapor deposition, spin-on glass formation, and thermal oxidation of the substrate.

The gate electrode layer 204 may be formed using a variety of materials including, for example, polysilicon and metals, such as, for example, aluminum, tungsten, copper, iridium, titanium and cobalt. Typically, the gate electrode layer 204 is made of polysilicon. The gate electrode layer 204 may be formed using a variety of techniques, including, for example, chemical vapor deposition, physical vapor deposition, and sputtering.

A protective layer 205 is formed over a top surface of the gate electrode layer 204, as shown in FIG. 2A. The material used to form the protective layer 205 is typically a dielectric material, however, other materials may be used. The protective layer 205 is often formed using a material that can be selectivity etched with respect to the gate electrode layer. Examples of suitable materials include, for example, silicon nitride, silicon oxynitride, nitrided silicon oxide, silicon dioxide, or materials that form an antireflective coating over the gate electrode layer 204. The protective layer 205 may be formed using a variety of techniques, including, for example, chemical vapor deposition, physical vapor deposition, sputtering, and spin-on glass formation.

Figure 2B:
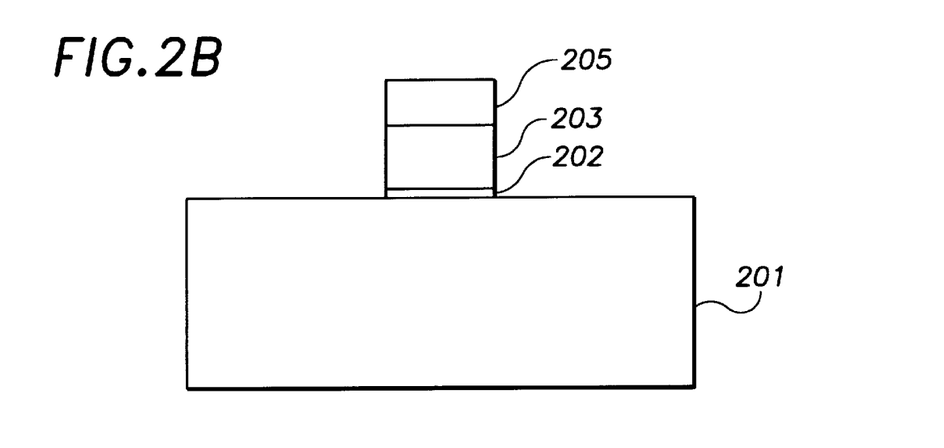

A gate electrode 203 is then formed including removal of portions of the gate electrode layer 204, gate insulating layer 202, and protective layer 205, as shown in FIG. 2B. This can be accomplished, for example, by depositing photoresist material over the protective layer and then patterning and etching to leave photoresist material over only those regions corresponding to the gate electrode(s). The exposed protective layer and underlying gate electrode layer can be simultaneously or sequentially removed by techniques, such as, for example, selective and/or anisotropic etching. Portions of the gate insulating layer 202 adjacent to the gate electrode 203 may be removed, as shown, or kept, if desired. Typically, the gate electrode 203 has an initial width ranging from, for example, 1500 to 3500 Angstroms (0.15 to 0.35 $\mu$m) when formed, however, this process can also be used with smaller or larger gate electrodes.

Other processes can also be used to form the gate electrode 203 and protective layer 205 structure depicted in FIG. 2B. In one alternative embodiment, photoresist material (not shown) is deposited on the substrate, patterned, and etched to form openings (not shown) exposing a portion of the substrate and corresponding to the position of the gate electrodes. An insulating layer is formed on the substrate within the opening by chemical vapor deposition, physical vapor deposition, or thermal oxidation. The gate electrode is then formed in the opening using known deposition and polishing techniques. The protective layer is formed in the opening above the gate electrode. The protective layer may also be formed using known deposition and polishing techniques. The remaining photoresist material may then be removed leaving the gate electrode and protective layer.

Figure 2C:
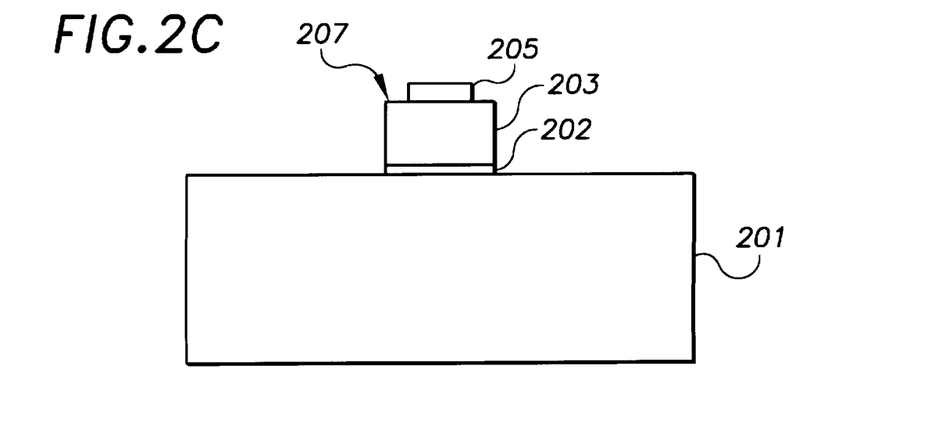

Returning to FIGS. 2A–2E, the protective layer 205 initially extends over the entire gate electrode 203. After formation, the protective layer 205 is selectively trimmed, as illustrated in FIG. 2C. Selectively trimming the protective layer 205 exposes and defines a peripheral region 207 of the gate electrode 203. The remaining portion of the protective layer 205 is disposed over and defines a central region 209 of the gate electrode 203. The selective trimming can be accomplished by a number of techniques, including, for example, selectively and/or isotropically or anisotropically etching the protective layer 205. Often, the etching of the protective layer 205 is a timed etching process to achieve a desired amount of exposure of the peripheral region of the gate electrode 203.

A lower portion of the peripheral region will be used to form LDD regions. The width of the peripheral region and the amount of trim is suitably selected in consideration of the desired width of the LDD regions. The amount of trim may range from, for example, about 250 to 500 Angstroms, although larger or smaller peripheral regions can be exposed. Depending on the initial width of the gate, this trimming process can be used to reduce the size of the gate electrode by 5 to 50% or more.

Typically, isotropic etching removes portions of both the top and sides of the protective layer 205. Often isotropic etching reduces the thickness of the protective layer by an amount equal to the amount that is etched away from each side of the protective layer 205. Thus, when using an isotropic etch, the initial thickness of the protective layer 205 is usually provided to be larger (typically at least 20% larger) than the distance that the protective layer 205 is etched back from the peripheral edge of the gate electrode 203.

Anisotropic etching can also be used. Anisotropic etching typically results in the top surface of the protective layer 205 being etched faster or slower than the sidewalls. The thickness of the protective layer 205 is typically appropriately sized to leave a portion of the protective layer 205 after etching.

For many applications, the initial thickness of the protective layer 205 is typically at least 300 Angstroms and, usually, at least 600 Angstroms. Often the initial thickness of the protective layer 205 ranges from, for example, 1000 to 3000 Angstroms. Usually the protective layer 205 has a thickness of at least 50 Angstroms and often at least 500 to 1000 Angstroms after exposing the peripheral region 207 of the gate electrode 203.

Figure 2D:
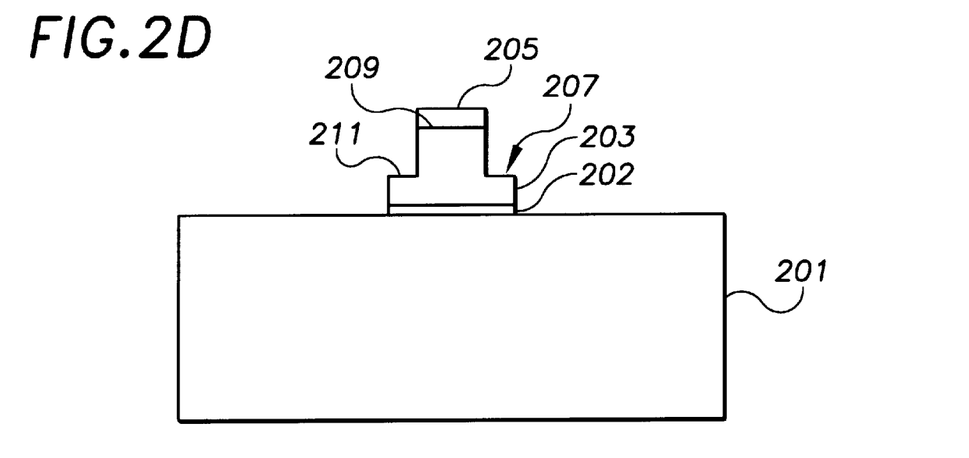

After the peripheral region 207 is exposed, an upper portion of the peripheral region 207 of the gate electrode 203 can be removed to typically leave an underlying portion 211, as shown in FIG. 2D. The protective layer 205 usually prevents the removal of any substantial portion of the central region 209 of the gate electrode 203. The removal of the upper portion of the peripheral region 207 can be accomplished by a variety of techniques, including, for example, anisotropic etching techniques. Often, an anisotropic etching technique is used so that the width of the gate electrode 203, at its base near the substrate 201, is not reduced at all or is only reduced by a relatively small amount. The etchants used to remove the upper portion of the peripheral region 207 of the gate electrode 203 may or may not be selective to the gate electrode 203. If the gate electrode 203 is not selectively etched, then the thickness of the protective layer 205 is typically large enough to prevent etching of the underlying central region 209 of the gate electrode 203.

By removing the upper portion of the peripheral region 207, the thickness of the gate electrode 203 in the peripheral region 207 is reduced. Typically, the thickness of the underlying portion 211 of the peripheral region 207 ranges from, for example, 100 to 500 Angstroms, although larger or smaller underlying portions of the peripheral region 207 may be formed. The thickness of the underlying portion of the peripheral region 207 may determine, at least in part, the depth of a lightly-doped region 215 (see FIG. 2E).

The amount of the reduction in thickness of the peripheral region 207 can be controlled by a variety of techniques, including, for example, using timed etching to remove only a desired amount of material or using an etch stop. One suitable etch stop is a nitrogen-bearing region within the gate electrode 203. The nitrogen-bearing region may be formed by implantation of a nitrogen species into the gate electrode or by forming a lower portion of the gate electrode layer 204 in a nitrogen-bearing ambient. In addition to providing an etch stop, the nitrogen in the lower portion of the gate electrode may be advantageous because nitrogen can often prevent or reduce penetration of dopant material, such as boron, from the channel during formation or operation of the semiconductor device.

Figure 2E:
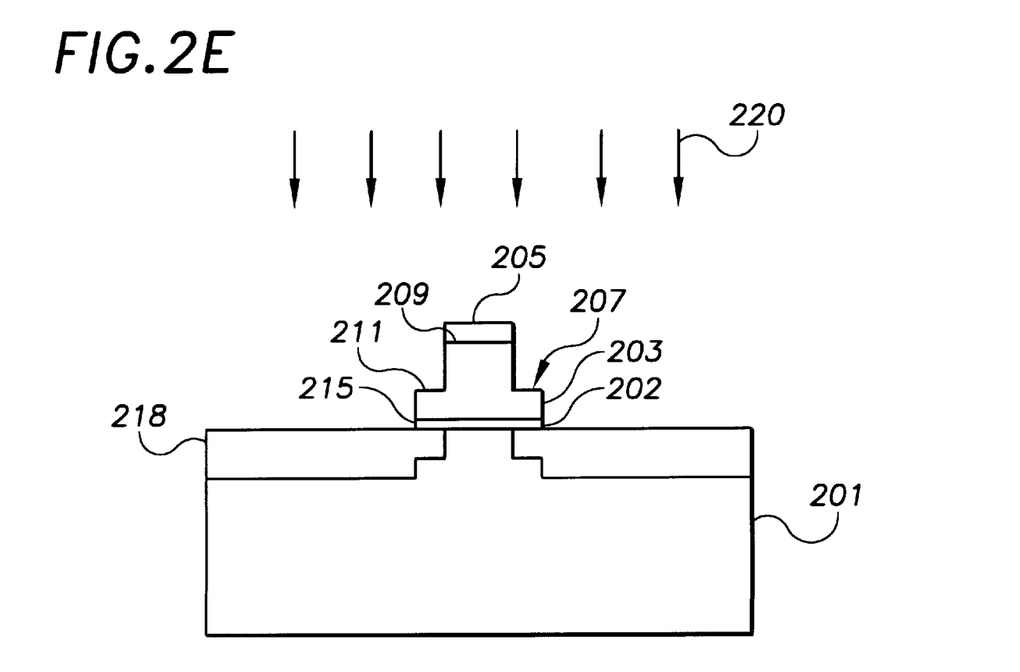

A dopant material 220 is implanted into the substrate 201 to simultaneously form heavily-doped regions 218 and lightly-doped regions 215, as shown in FIG. 2E. The lightly-doped regions 215 and the heavily-doped regions 218 may be used as source/drain regions in the ultimately formed device. This single dopant implant step results in self-alignment of the lightly-doped regions 215 and heavily-doped regions 218 of the source and drain structures. This self-alignment of the heavily-doped regions 218 and lightly-doped regions 215 may reduce alignment errors between these regions and improve the reliability of the device.

Suitable n-type dopant materials include, for example, arsenic (As) and phosphorus (P). Suitable p-type dopant materials include, for example, boron and boron compounds, such as boron hydride and boron halides. Other suitable p-type dopant materials include, for example, indium and gallium. The implant energies and dosages of this implant are typically selected to provide a desired depth and resistivity of the lightly-doped regions 215 and heavily-doped regions 218. For many applications, suitable implant energies and dosages of the dopant material 220 range from, for example, 5 to 50 keV and 2E15 ($2 \times 10^{15}$) to 8E15 ($8 \times 10^{15}$) dopant atoms/cm$^2$, respectively. An optional anneal may be performed after implantation to activate the dopant material.

The protective layer 205 can be removed either before or subsequent to the implantation of the dopant material. The removal of the protective layer 205 can be performed by a variety of techniques, including, for example, selective etching and chemical, mechanical, or chemical/mechanical polishing.

Figure 3A:
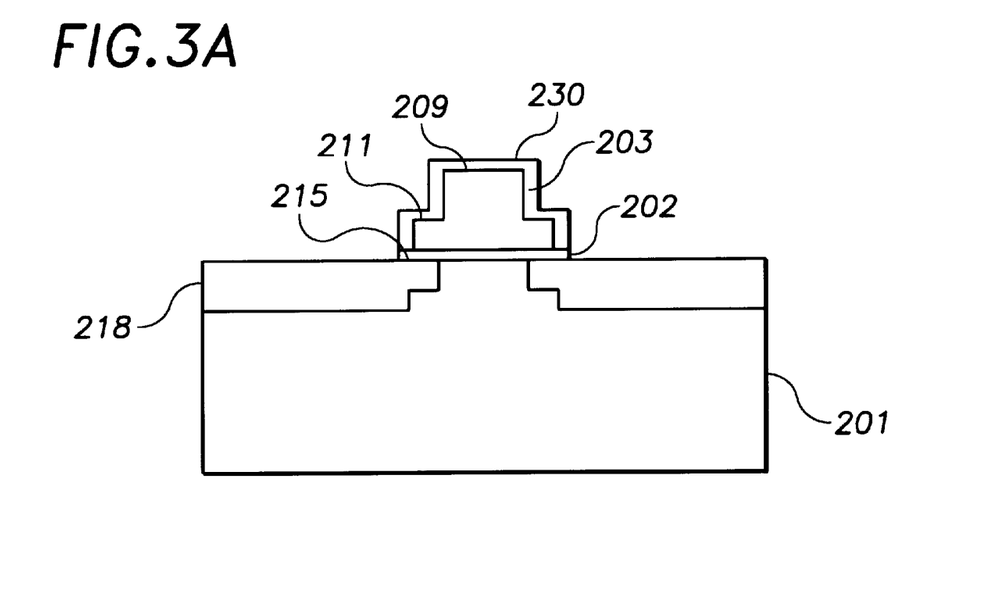
FIGS. 3A through 3B illustrate two exemplary semiconductor device structures formed in accordance with embodiments of the invention.

Spacers may be formed on sidewalls of the gate electrode to prepare the device for silicidation. The spacers may be formed using conventional deposition and etching techniques. Alternatively, sidewall spacers may be formed by oxidizing the gate electrode. For example, the underlying portion 211 of the peripheral region 207 of the gate electrode 203 can be partially oxidized to form an optional oxide layer 230 that can be used as a spacer, as shown in FIG. 3A. Partial oxidation results in a gate electrode 203 with peripheral portions 207 extending from a thicker central region 209. The portion of the oxide layer 230 over the top of the gate electrode 203 may be removed by known techniques, such as, for example, anisotropic etching, prior to silicidation.

Figure 3B:
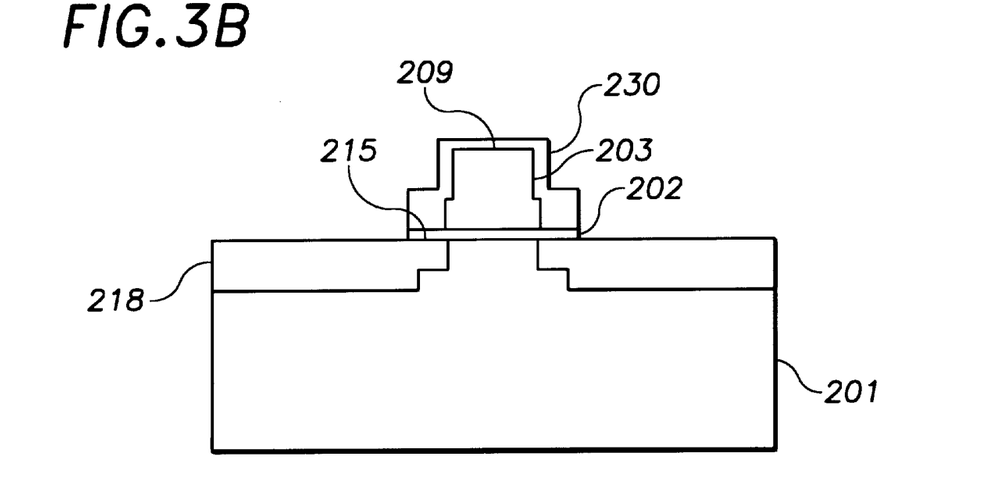

In other embodiments, the underlying portion 211 of the peripheral region 207 may be completely oxidized (i.e., substantially all of the original underlying portion 211 is oxidized) to form an oxide layer 230, as shown in FIG. 3B. The gate electrode 203 in these embodiments can have a width that is greatly reduced from the initial width. Although this can result in a gate electrode 203 having substantially straight sidewalls, in at least some instances, the gate electrode 203 may have slight extensions and/or sloped sidewalls. The lightly-doped regions 215 may extend to the reduced gate electrode 203 as a result of thermal diffusion after an annealing process.

Figure 4A:
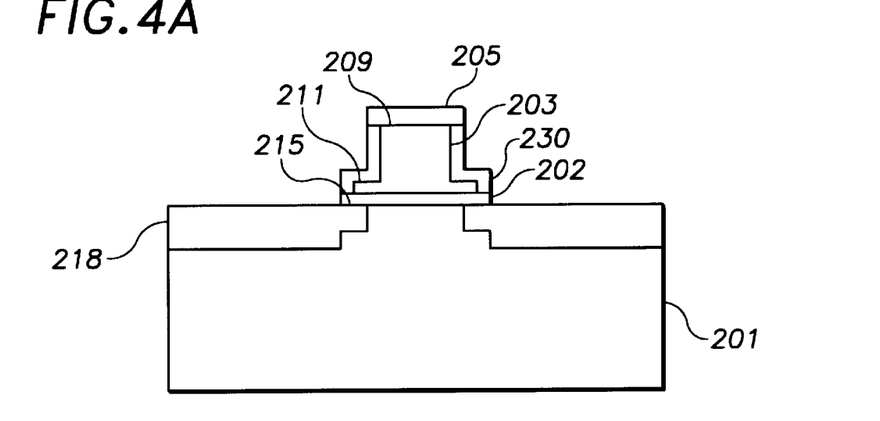
FIGS. 4A through 4B illustrate another two exemplary semiconductor device structures formed in accordance with yet other embodiments of the invention.
Figure 4B:
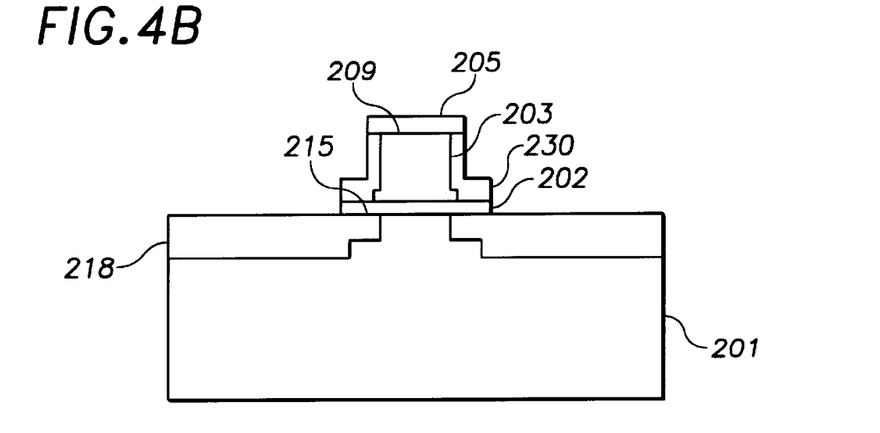

In yet other embodiments, the protective layer 205 is not removed before the formation of the optional oxide layer 230 by either partial or complete oxidation, as shown in FIGS. 4A and 4B, respectively. The use of the protective layer 205 to protect the upper surface of the central portion 209 of the gate electrode 203 from oxidation can prevent or restrict the formation of an unwanted oxide layer over the central portion 209 of the gate electrode 203. The protective layer 205 may be removed and the upper surface of the gate electrode can then be used, for example, to form a silicide contact by known silicidation techniques.

Figure 5:
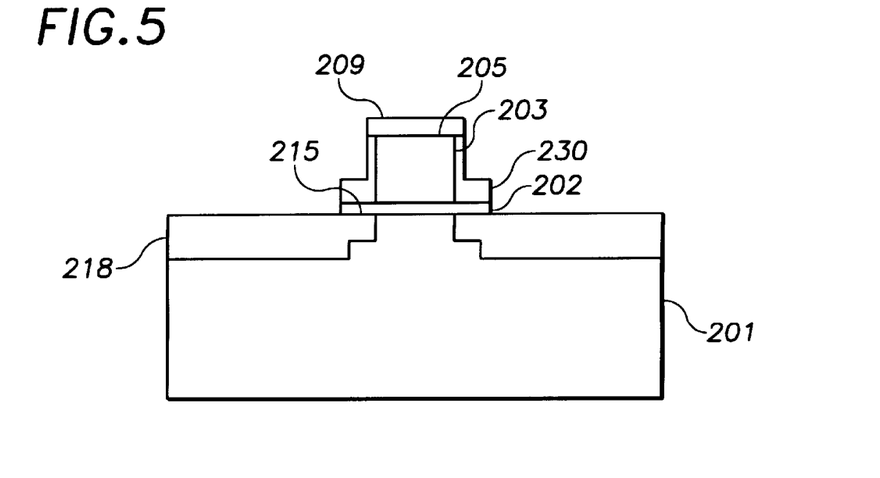
FIG. 5 illustrates yet another exemplary semiconductor device structure formed in accordance with another embodiment of the invention.

In another embodiment, oxidation of the underlying portion 211 of the gate electrode 203 is performed at a faster rate than the oxidation of the central region 209 of the gate electrode to form the structure illustrated in FIG. 5. This can be accomplished by, for example, leaving the protective layer 205 over the central region 209 of the gate electrode 203 during the implantation of an n-type dopant material 220. Thermal oxidation of the gate electrode occurs more rapidly in n-doped polysilicon than in undoped polysilicon. Thus, the peripheral region 207 of the gate electrode 203 may be more rapidly oxidized than the central region 209.

The above process can be used to form a number of different semiconductor devices, including, but not limited to, MOS structures such as PMOS devices, NMOS devices, complimentary MOS (CMOS) semiconductor devices having both PMOS and NMOS devices and bipolar CMOS (BiCMOS) devices. In a CMOS device, for example, the NMOS device regions may be masked off while the above process is carried out on the PMOS device regions and the PMOS device regions may be masked off while the above process is carried out on the NMOS device regions. Alternatively, fabrication of the NMOS and PMOS device regions may occur simultaneously, with masking typically used only during the dopant implantation steps. For example, during the dopant implantation of the device regions of the NMOS region, the PMOS region is masked, and vice versa. Fabrication may continue with well-known processing steps including, for example, silicidation, interconnect formation and so forth to complete the ultimate device structure.

As noted above, the present invention is applicable to the fabrication of a number of semiconductor devices, including in particular MOS structures, having source/drain regions and LDD regions or a narrower gate electrode. Accordingly, the present invention should not be considered limited to the particular examples described above, but rather should be understood to cover all aspects of the invention as fairly set out in the accompanying claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A method for making a semiconductor device, comprising:
   forming a gate electrode over a substrate including one of implanting a nitrogen species into a lower portion of the gate and forming a lower portion of the gate electrode in a nitrogen-bearing ambient, the lower portion having a nitrogen-bearing region adapted to act as an etch stop;
   forming a protective layer over the gate electrode;
   selectively removing a portion of the protective layer to expose a peripheral region of the gate electrode, a remainder of the protective layer remaining disposed over a central region of the gate electrode; and
   using the etch stop and removing an upper portion of the peripheral region of the gate electrode.

2. The method of claim 1, wherein removing the upper portion of the peripheral region of the gate electrode comprises leaving a lower portion of the peripheral region.

3. The method of claim 2, further comprising oxidizing a part of the underlying portion.

4. The method of claim 3, further comprising implanting a dopant material in the substrate to simultaneously form a lightly-doped region beneath the underlying portion of the peripheral region of the gate electrode and a heavily-doped region adjacent to the gate electrode subsequent to oxidizing a part of the underlying portion.

5. The method of claim 3, further comprising implanting a dopant material in the substrate to simultaneously form a lightly-doped region beneath the underlying portion of the peripheral region of the gate electrode and a heavily-doped region adjacent to the gate electrode prior to oxidizing a part of the underlying portion.

6. The method of claim 3, wherein oxidizing a part of the underlying portion includes oxidizing substantially all of the underlying portion.

7. The method of claim 2, further comprising implanting a dopant material in the substrate to simultaneously form a lightly-doped region beneath the underlying portion of the peripheral region of the gate electrode and a heavily-doped region adjacent to the gate electrode.

8. The method of claim 1, wherein selectively removing a portion of the protective layer to expose a peripheral region comprises selectively removing a portion of the protective layer to expose a peripheral region extending inward from an edge of the gate electrode up to 500 Angstroms.

9. The method of claim 1, further comprising removing the protective layer.

10. The method of claim 9, wherein the protective layer is removed prior to implanting the dopant material.

11. The method of claim 9, wherein the protective layer is removed subsequent to implanting the dopant material.

12. The method of claim 9, further comprising oxidizing, prior to removing the protective layer, at least a part of an underlying portion of the gate electrode remaining after removal of the upper portion of the peripheral region of the gate electrode.

13. The method of claim 9, further comprising oxidizing, subsequent to removing the protective layer, at least a part of an underlying portion of the gate electrode remaining after removal of the upper portion of the peripheral region of the gate electrode.

14. A method for making a semiconductor device, comprising:

forming a gate electrode over a substrate including one of implanting a nitrogen species into a lower portion of the gate and forming a lower portion of the gate electrode in a nitrogen-bearing ambient, the lower portion having a nitrogen-bearing region adapted to act as an etch stop;

forming a protective layer over the gate electrode;

selectively removing a portion of the protective layer to expose a peripheral region of the gate electrode, a remainder of the protective layer remaining disposed over a central region of the gate electrode; and using the etch stop and removing an upper portion of the peripheral region of the gate electrode leaving an underlying portion; and forming simultaneously a heavily-doped region in the substrate adjacent the gate electrode and a lightly-doped region in the substrate beneath the underlying portion of the gate electrode.

15. The method of claim 14, further comprising oxidizing a part of the underlying portion.

16. The method of claim 14, further comprising oxidizing substantially all of the underlying portion.

17. The method of claim 14, wherein forming simultaneously the heavily-doped region in the substrate adjacent the gate electrode and the lightly-doped region in the substrate beneath the underlying portion of the peripheral region of the gate electrode comprises implanting a dopant material into the substrate.

18. A semiconductor device, comprising:

a substrate; and a gate electrode disposed on the substrate, the gate electrode having a central region with a first thickness and a peripheral region extending laterally from the central region with a second thickness that is less than the first thickness, a lower portion of the peripheral region nearest the substrate having one of a nitrogen implant forming a nitrogen-bearing region and a lower portion of the gate electrode formed in a nitrogen-bearing ambient.

19. The semiconductor device of claim 18, wherein the gate electrode has a width ranging from 500 to 2000 Angstroms.

20. The semiconductor device of claim 18, wherein the central region of the gate electrode has a width ranging from 500 to 1500 Angstroms.

21. The semiconductor device of claim 18, further comprising a dielectric layer disposed on at least a portion of the gate electrode.

22. The semiconductor device of claim 21, wherein the dielectric layer comprises a thermally oxidized portion of the gate electrode.

23. A semiconductor device formed by the method of claim 1.

24. The method of claim 1, wherein forming a gate electrode over a substrate comprises:

forming a thin gate oxide layer on the substrate;

forming a gate electrode layer on the thin gate oxide layer;

forming a protective layer over the gate electrode layer;

patterning a mask layer on a selected portion of the protective layer; and using the patterned mask layer and selectively removing portions of the protective layer, the gate electrode layer, and the thin gate oxide layer not patterned by the mask layer to expose the substrate.

25. The device of claim 18, wherein the nitrogen-bearing region is adapted to reduce penetration of dopant material from a channel in the substrate below the gate.

26. The device of claim 18, wherein the nitrogen-bearing region is adapted to prevent penetration of dopant material from a channel in the substrate below the gate.

27. The device of claim 18, wherein the nitrogen-bearing region is formed across the entire width of the gate.

* * * * *

UNITED STATES PATENT AND TRADEMARK OFFICE
CERTIFICATE OF CORRECTION

PATENT NO.     : 6,124,172
DATED          : September 26, 2000
INVENTOR(S)    : Gardner et al.

It is certified that error appears in the above-identified patent and that said Letters Patent is hereby corrected as shown below:

Column 1,
Line 25, "modem" should read -- modern --.

Signed and Sealed this

Fourth Day of February, 2003

JAMES E. ROGAN
*Director of the United States Patent and Trademark Office*